US007739564B1

(12) United States Patent
Lai et al.

(10) Patent No.: US 7,739,564 B1
(45) Date of Patent: Jun. 15, 2010

(54) TESTING AN INTEGRATED CIRCUIT USING DEDICATED FUNCTION PINS

(75) Inventors: Andrew Wing-Leung Lai, Fremont, CA (US); Tuyet Ngoc Simmons, Monte Sereno, CA (US)

(73) Assignee: Xilinx, Inc., San Jose, CA (US)

( * ) Notice: Subject to any disclaimer, the term of this patent is extended or adjusted under 35 U.S.C. 154(b) by 729 days.

(21) Appl. No.: 11/726,073

(22) Filed: Mar. 21, 2007

(51) Int. Cl.
*G01R 31/28* (2006.01)
(52) U.S. Cl. ........................ 714/725; 714/727
(58) Field of Classification Search ............... 702/117; 326/38, 40; 714/726, 729, 725, 727
See application file for complete search history.

(56) References Cited

U.S. PATENT DOCUMENTS 6,101,457 A * 8/2000 Barch et al. ................. 702/117
6,160,418 A * 12/2000 Burnham ..................... 326/38
7,265,578 B1 * 9/2007 Tang et al. .................... 326/40
7,392,446 B1 * 6/2008 Simmons et al. ............ 714/725
7,624,321 B2 * 11/2009 Whetsel ...................... 714/727
7,631,235 B2 * 12/2009 Plunkett ...................... 714/727

* cited by examiner

*Primary Examiner*—David Ton
(74) *Attorney, Agent, or Firm*—W. Eric Webostad

(57) ABSTRACT

Testing an integrated circuit using dedicated function pins in a non-dedicated function test mode is described. In a first mode, a circuit block is activated for processing first information provided via dedicated function pins. In a second mode, the circuit block is deactivated. Control logic is coupled to receive state information from a state storing device and coupled to receive the first information and second information from the dedicated function pins. The control logic is configured to gate the second information for passage to programmable logic responsive to the state information being for the second mode. The control logic is configured to gate the first information to preclude passage to the programmable logic responsive to the state information being for the first mode.

20 Claims, 4 Drawing Sheets

TESTING AN INTEGRATED CIRCUIT USING DEDICATED FUNCTION PINS

FIELD OF THE INVENTION

One or more aspects of the invention relate generally to integrate circuits and, more particularly, to testing an integrated circuit using dedicated function pins in a non-dedicated function test mode.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA is the Xilinx Virtex® FPGA available from Xilinx, Inc., 2100 Logic Drive, San Jose, Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

Conventionally, FPGAs were loaded into an Automated Test Equipment ("ATE") multi-site testing platform for testing, with dedicated function pins being used solely for dedicated function testing. Although the example of testing FPGAs is used herein, it should be appreciated that any of a variety of known PLDs having dedicated function pins may be used. Furthermore, for purposes of clarity and not limitation, "FPGA fabric," which may for example include programmable logic or programmable routing ("programmable logic"), is used to describe the type of testing being done for FPGAs.

An example of dedicated function pins is JTAG pins. JTAG pins conventionally have been exclusively used for dedicated function testing, such as for boundary scan ("BSCAN") testing of ICs including FPGAs. However, having to allocate separate sets of pins for dedicated function pins as part of an ATE multi-site testing platform places an additional burden on pin constraints of such ATE multi-site testing platform. These dedicated function pins may thus effectively limit the total number of test sites available for coupling FPGAs to a single ATE multi-site testing platform for simultaneous testing of FPGAs. Accordingly, such burden may constrain test throughput. Other examples of dedicated function pins are those pins heretofore used solely for configuration of FPGA fabric for testing, but not used to access FPGA fabric for testing via application of a test pattern for example.

Non-dedicated function pins, such as input/output pins ("I/Os"), may be used for testing FPGA fabric. Some of these non-dedicated function pins are not used for testing FPGA fabric, and these non-dedicated function pins of such an FPGA may be shorted together, as is known. This shorting of some non-dedicated function pins facilitates simultaneous testing of multiple FPGAs on a single ATE multi-site testing platform. This shorting may be done with use of a circuit board, such as a "daughter card" test board, associated with an ATE multi-site testing platform integrated circuit handler ("handler"). An example of a multi-site testing platform for probe or package level semiconductor testing is the Flex test platform from Teradyne of Boston, Mass., although there other known multi-site testing platforms which may be used. However, the ability to test multiple FPGAs at the same time using a single ATE multi-site testing platform is still limited by the number of non-dedicated function pins available to receive test pattern signaling and provide such test pattern signaling to FPGA fabric.

Accordingly, it would be desirable and useful to provide means to increase test throughput for an ATE multi-site testing platform.

SUMMARY OF THE INVENTION

One or more aspects of the invention generally relate to testing an integrated circuit using dedicated function pins in a non-dedicated function test mode.

An aspect of the invention is an integrated circuit having an interface with dedicated function pins. The dedicated function pins are coupled to an associated circuit block. A state-storing device is capable of being set to either a first state or a second state for respectively selecting either a first mode or a second mode. In the first mode, the circuit block is activated for processing first information provided via the dedicated function pins. In the second mode, the circuit block is deactivated. Control logic is coupled to receive state information from the state-storing device and coupled to receive the first information and second information from the dedicated function pins. The control logic is configured to gate the second information for passage to programmable logic responsive to the state information being for the second mode. The control logic is configured to gate the first information to preclude passage to the programmable logic responsive to the state information being for the first mode.

Another aspect of the invention is a method for simultaneously testing a plurality of integrated circuits using a single multi-site testing platform. The integrated circuits are loaded into the ATE multi-site testing platform. Programmable logic of the integrated circuits is configured. Integrated circuits are set for a non-dedicated function test mode. The integrated circuits in the non-dedicated function test mode are simultaneously tested using a portion of dedicated function pins of each of the integrated circuits. The portion of the dedicated function pins are for providing information for processing by the programmable logic of each of the integrated circuits for the testing.

Yet another aspect of the invention is a system to simultaneously test multiple integrated circuits. A multi-site testing platform includes Automated Test Equipment ("ATE") and a handler. The handler is for loading the multiple integrated circuits for electrical communication with the ATE. The ATE is configured for setting the multiple integrated circuits into a non-dedicated function test mode. The ATE is configured for providing non-dedicated function test input to dedicated function pins of the multiple integrated circuits for simultaneously testing programmable logic of the multiple integrated circuits in the non-dedicated function test mode.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different. Furthermore, for ease of illustration and for purposes of clarity, single signal paths and associated circuits are illustratively shown even though in instances such single signal paths and associated circuits may represent multiple iterations thereof.

Figure 1:
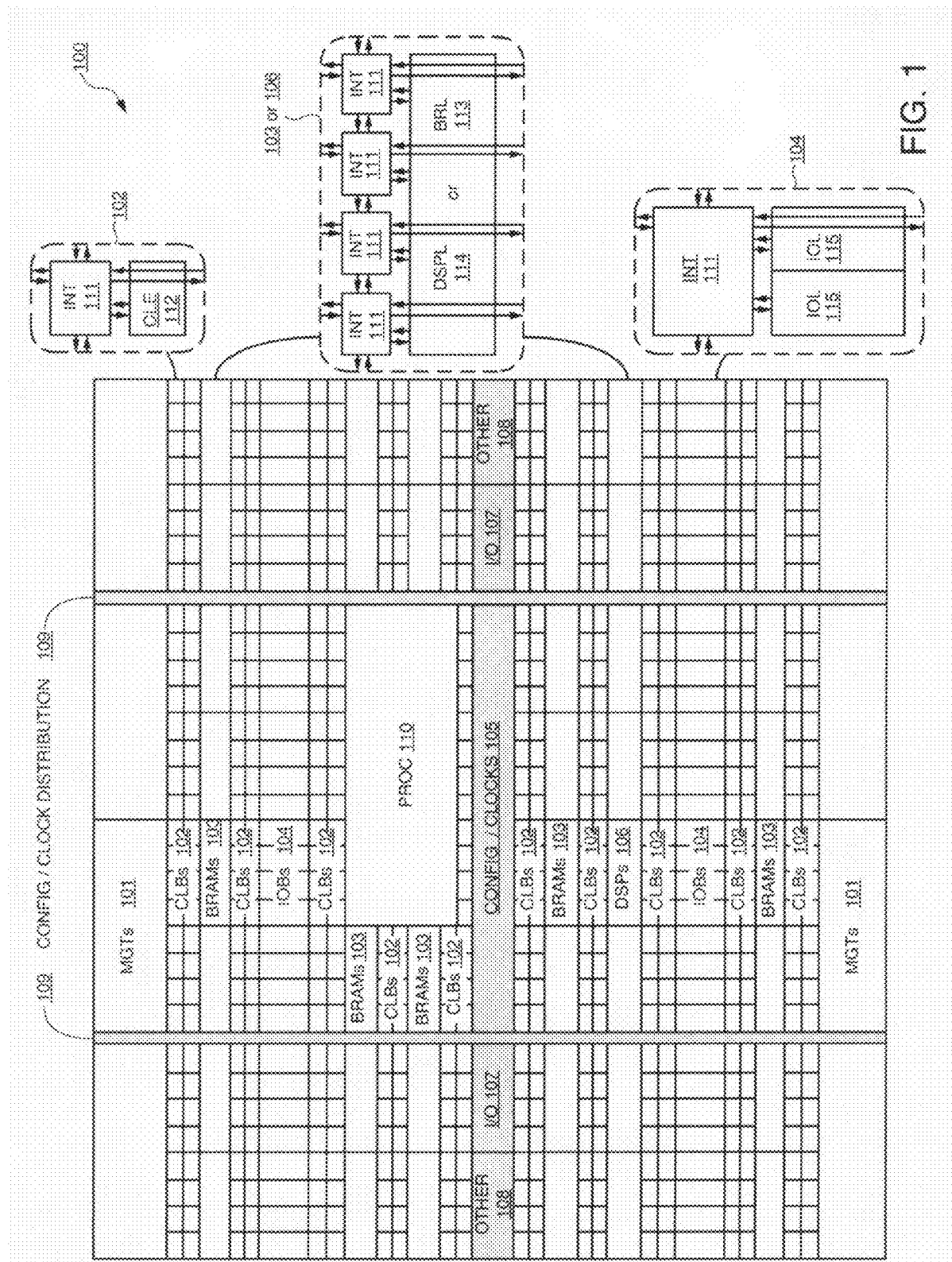
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex™-4 FPGA from Xilinx, Inc., of San Jose, Calif.

In the following description, JTAG pins are described as being used for non-JTAG testing but still available for JTAG testing. By having JTAG pins available for dual-purpose testing, namely testing of both FPGA fabric and BSCAN testing, test patterns which previously were pin constrained may have increased test efficiency, namely more pin bandwidth, for FPGA fabric testing. Moreover, test patterns which previously may not have been used due to pin constraints may now be used.

Furthermore, rather than increasing test efficiency on a per-FPGA basis, it should be appreciated that more FPGAs may be loaded into a multi-site testing platform as more pins are available for non-JTAG testing, which may be used to increase overall test throughput as more FPGAs may be tested simultaneously on a single ATE multi-site testing platform. Although JTAG pins of an FPGA as associated with a BSCAN block for BSCAN testing are described, it should be appreciated that other known types of dedicated function pins and disabling of associated circuitry may be used.

Notably, some non-dedicated function pins may be shorted together for testing, and test patterns designed to take into account shorted pins may be used to test those pins that are shorted as is known. However, this type of testing of shorted pins may account for less than five percent (5%) of the testing done for an FPGA. Accordingly, the majority of FPGA testing is consumed by testing of FPGA fabric. Thus, ability to use JTAG pins, or other dedicated function pins, for testing FPGA fabric is a significant enhancement of pin bandwidth.

Known types of dedicated function pins other than JTAG pins of an FPGA may be used. For example, mode pins and other pins heretofore only used during configuration of an FPGA may be used. In other words, once an FPGA is configured for testing, pins used for such configuration may be subsequently used for testing FPGA fabric. Such configuration pins may be associated with circuitry to divert test pattern signaling post-configuration for testing FPGA fabric in accordance with the following description. Examples of FPGA configuration pins include configuration mode pins, data in/data out configuration pins, chip select pins, hot swapping pins, and initialization pins.

Figure 2:
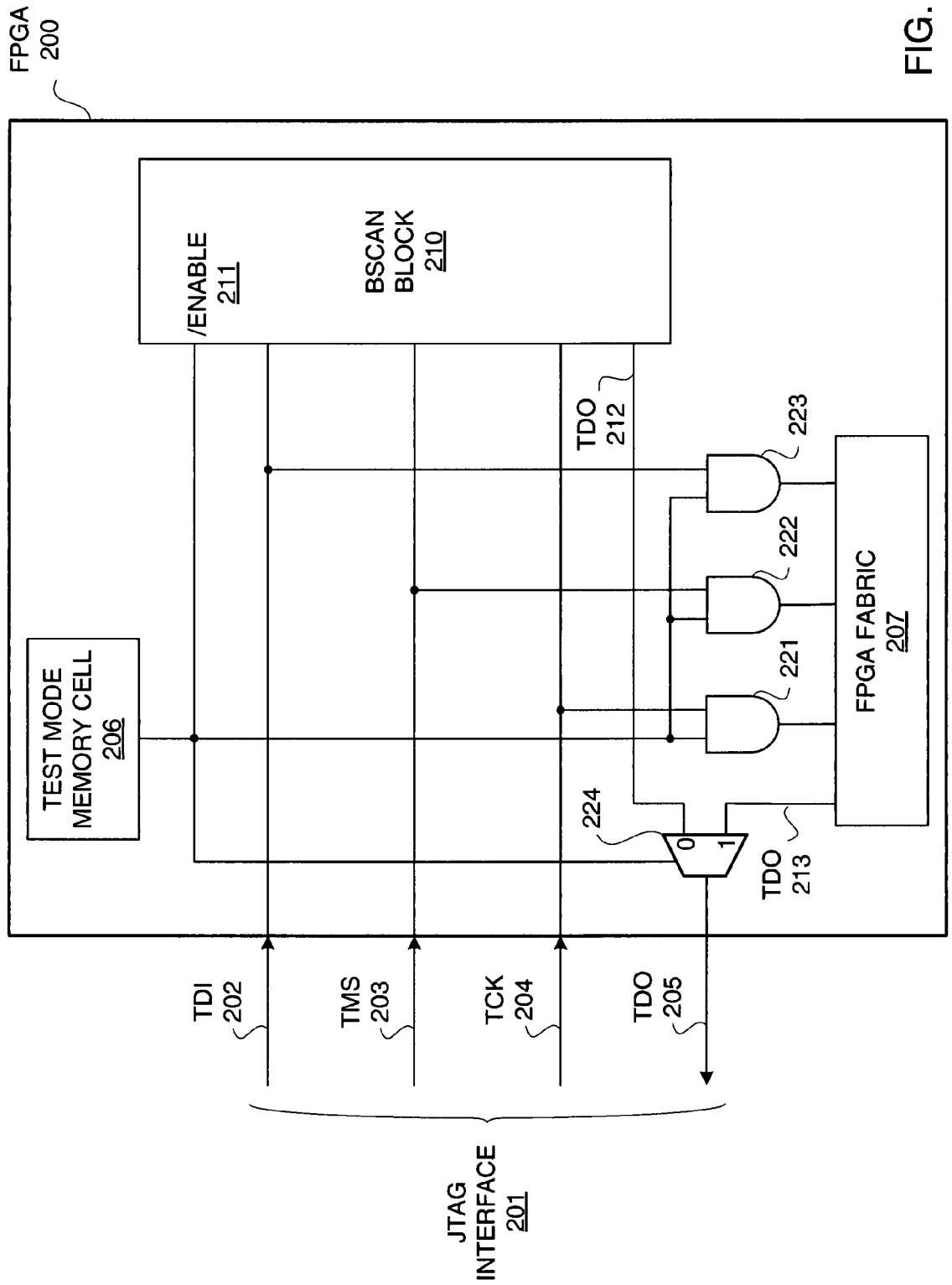
FIG. 2 is a block/circuit diagram depicting an exemplary embodiment of an FPGA.

FIG. 2 is a block/circuit diagram depicting an exemplary embodiment of an FPGA 200. FPGA 200 may be FPGA 100 of FIG. 1. FPGA 200 includes a storage device, which in this example is a test mode memory cell 206, and a BSCAN block 210. Notably, other devices that may be used instead of or in addition to test mode memory cell 206 include one or more registers, a latch, or any of a variety of known types of memory cells.

FPGA 200 further includes control logic which is coupled to FPGA fabric 207. Control logic of FPGA 200 in this example includes AND gates 221 through 223 and multiplexer 224. As shall be apparent from the following description, other known configurations for control logic, particularly other known types of gates and selection circuits, may be used.

FPGA 200 includes JTAG interface 201. JTAG interface 201 includes test data-in ("TDI") pin 202, test mode select ("TMS") pin 203, test clock ("TCK") pin 204, and test data-out ("TDO") pin 205. Although single instances of each of pins 202 through 205 are illustratively shown for JTAG interface 201 it should be appreciated that multiple instances of one or more of such pins may be implemented as is known. Accordingly, for purposes of clarity and not limitation, single instances of pins, as well as corresponding circuits, are illustratively shown for purposes of clarity and not limitation.

Test data provided as input to FPGA 200 may be provided via TDI pin 202 when FPGA 200 is in a JTAG testing mode. Furthermore, a test mode select signal and a test clock signal may respectively be provided via TMS pin 203 and TCK pin 204 to FPGA 200 when in a JTAG testing mode. Examples of JTAG test modes are known, and include a BSCAN mode of testing. Accordingly, input provided via pins 202 through 204 is provided to BSCAN block 210 for processing in a JTAG testing mode.

In this mode, test mode memory cell 206 may be set such that its output precludes passage of input provided via pins 202 through 204 to FPGA fabric 207. Accordingly, a logic 0 in the example is output from test mode memory cell 206 and provided as an input to each of AND gates 221 through 223. The other input of such two-input AND gates 221 through 223 is respectively obtained from input provided via pins 204 through 202, respectively.

For a logic 0 output from test mode memory cell 206, BSCAN block 210 is activated. Accordingly, output from test mode memory cell 206 may be provided to a negative logic enable port ("/ENABLE") 211 of BSCAN block 210.

Responsive to input provided via pins 202 through 204 to BSAN block 210, BSCAN block 210 provides test data output signal ("TDO") 212. Test data output signal 212 is provided to a logic low input port of multiplexer 224. Output from test mode memory cell 206 is provided to a control select port of multiplexer 224. For the JTAG test mode, output of test mode memory cell 206 is a logic 0, meaning that input provided to the logic 0 input port of multiplexer 224, which is in this example is test data output signal 212, is provided as test data output from FPGA 200 via TDO pin 205. Again, test data output signal 212 may be more than a single pin wide, and accordingly, it should be appreciated that even though a single instance is shown, multiple instances of signals and corresponding circuitry may be used.

For a non-JTAG test mode, test mode memory cell 206 may be set to a logic 1. Thus even though input may be provided from pins 202 through 204 to BSCAN block 210, for a logic 1 output from test mode memory cell 206 and provided to /ENABLE port 211, BSCAN block 210 is disabled.

In the non-JTAG test mode, input provided to pins 202 through 204 is not limited to a JTAG protocol but may be input provided as a test pattern to test FPGA fabric 207. Accordingly, test pattern input provided via one or more of pins 202 through 204 is respectively provided to AND gates 223 through 221. For a logic 1 output from test mode memory cell 206 to each of AND gates 221 through 223, output from each of AND gates 221 through 223 is a respective gated version of the input provided from each of pins 204 through 202, respectively.

For the non-JTAG test mode, namely for test pattern data provided from one or more of AND gates 221 through 223 to FPGA fabric 207, FPGA fabric 207, having been configured for testing, provides test data output signal ("TDO") 213 responsive to such test pattern data. Test data output signal 213 may be provided to a logic 1 input port of multiplexer 224. For test mode memory cell 206 output being a logic 1, multiplexer 224 selects test data output signal 213 as output from FPGA 200 via TDO pin 205.

Accordingly, it should be understood that dedicated function pins, such as JTAG interface pins, may be used for providing test pattern data to test FPGA fabric 207 of FPGA 200. This may be facilitated by having control logic coupled between JTAG interface 201 and such FPGA fabric 207, as well as having a storage device for storing state to controllably select between two types of test modes, such as previously described.

Figure 3:
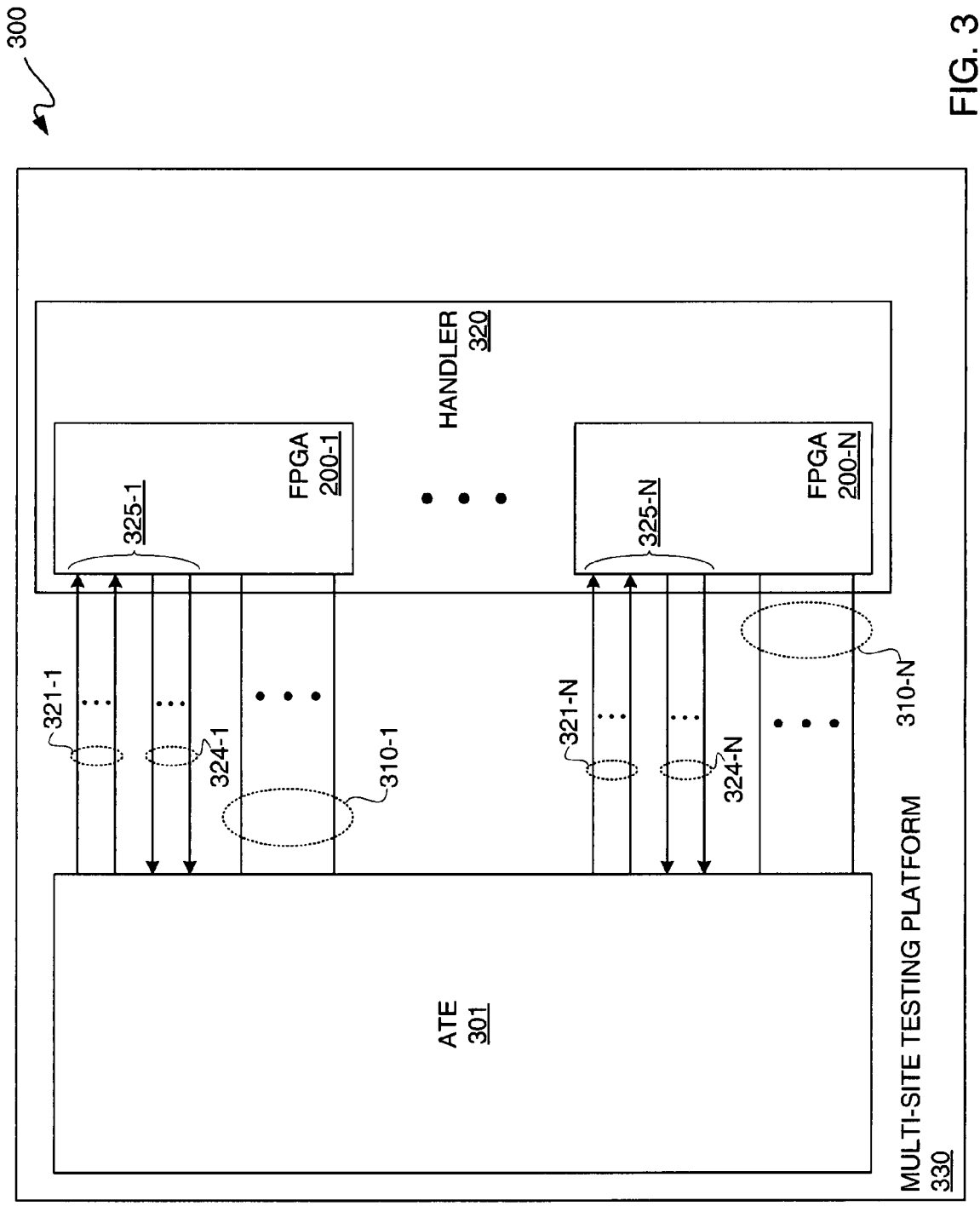
FIG. 3 is a block diagram depicting an exemplary embodiment of a test system.

FIG. 3 is a block diagram depicting an exemplary embodiment of a test system 300. Test system 300 includes multi-site testing platform 330. Multi-site testing platform 330 includes Automated Test Equipment ("ATE") 301 and handler 320. Loaded into handler 320 may be a plurality of FPGAs 200-1 through 200-N, for N a positive integer greater than 1.

Each FPGA 200-1 through 200-N may have associated therewith a set of pins 325-1 through 325-N, respectively. Each set of pins 325-1 through 325-N may include one or more input pins and one or more output pins, namely sets of input pins 321-1 through 321-N (collectively "pins 321") and output pins 324-1 through 324-N (collectively "pins 324"), respectively. Pins 321 and 324 of each FPGA 200-1 through 200-N may include one or more dedicated function pins. Again dedicated function pins may include one or more JTAG interface pins, one or more configuration pins, or a combination thereof.

Pins 310-1 through 310-N of each of FPGAs 200-1 through 200-N, respectively, may be known pins not included in the respective sets of pins 321 and 324 of each of those FPGAs. It should be appreciated that multiple FPGAs may be tested at the same time, where dedicated function pins may serve a dual purpose. For example, dedicated function pins, such as JTAG pins, may be used for boundary scan testing in one test mode and may be used for testing FPGA fabric in another test mode. Furthermore, configuration pins may be used to configure each of FPGAs 200-1 through 200-N for testing in a test configuration mode, and after such configuration, such configuration pins may be used for testing FPGA fabric of each of FPGAs 200-1 through 200-N.

Figure 4:
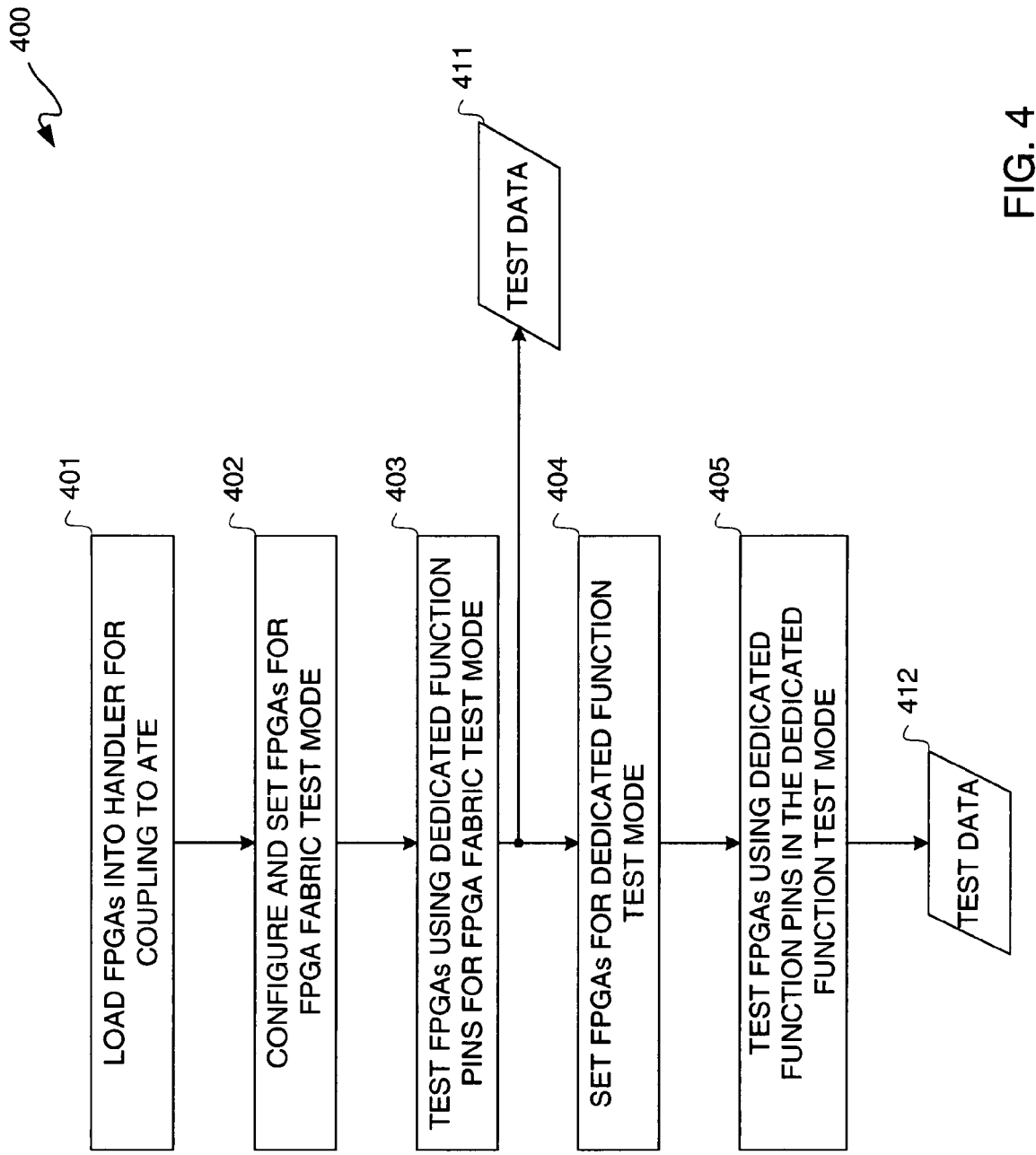
FIG. 4 is a flow diagram depicting an exemplary embodiment of a test flow.

FIG. 4 is a flow diagram depicting an exemplary embodiment of a test flow 400. Test flow 400 at 401 includes loading FPGAs into a handler for coupling to an ATE. At 402, FPGAs are configured and set for a non-dedicated function test mode, namely for testing FPGA fabric.

At 403, FPGAs are tested in the FPGA fabric test mode using dedicated function pins, such as for example one or more JTAG interface pins, FPGA configuration pins, or a combination thereof in the FPGA fabric test mode. For use of such dedicated function pins for testing of FPGAs in the FPGA fabric test mode at 403, a setting for an FPGA fabric test mode may involve programming a storage device to divert test pattern data provided to FPGA fabric, as previously described.

Responsive to test data input at 403, test data output 411 may be obtained. Notably, though not illustratively shown for purposes of clarity and not limitation, multiple iterations of 402 and 403 may be implemented for each type of configuration to be used for testing FPGA fabric, and consequently multiple sets of test data 411 may be obtained. Furthermore, it should be appreciated that multiple iterations of 403 using different sets of test data patterns in order to test such FPGA fabric may result in associated different sets of test data 411.

At 404, FPGAs may be set for a dedicated function test mode, such as for example a BSCAN test mode. This setting may involve switching the state of one or more storage devices to indicate a dedicated function test mode instead of an FPGA fabric test mode. In some embodiments, the dedicated function test mode may be set by an input pin or other direct signal, and not by a storage device. Notably, FPGA fabric need not be reconfigured at 404 for boundary scan testing. In other words, the FPGA need not be reconfigured to switch between test modes, as test mode memory cell 206 of FIG. 2 may be implemented as a control register that may be dynamically changed instead of using an FPGA configuration memory cell that is subject to being changed only during reconfiguration of such an FPGA. At 405, FPGAs may be tested using dedicated function pins, such as for example JTAG pins, for testing in the dedicated function test mode, such as for BSCAN testing. Responsive to testing at 405, test data 412 may be obtained, as is known.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An integrated circuit comprising:
an interface with dedicated function pins;
the dedicated function pins coupled to an associated circuit block;
a state storing device capable of being set to either a first state or a second state for respectively selecting either a first mode or a second mode;
in the first mode, the circuit block being activated for processing first information provided via the dedicated function pins;
in the second mode, the circuit block being deactivated;
control logic coupled to receive state information from the state storing device and coupled to receive the first information and second information from the dedicated function pins;
the control logic configured to gate the second information for passage to programmable logic responsive to the state information being for the second mode; and
the control logic configured to gate the first information to preclude passage to the programmable logic responsive to the state information being for the first mode.

2. The integrated circuit according to claim 1, wherein the circuit block is a boundary scan block; and
wherein the interface includes a test data in pin, a test mode select pin, a test clock pin, and a test data out pin.

3. The integrated circuit according to claim 1, wherein a portion of the dedicated function pins include at least one configuration pin selected from a group consisting of configuration mode pins, data in/data out configuration pins, chip select pins, hot swapping pins, and initialization pins.

4. The integrated circuit according to claim 1, wherein the control logic includes a multiplexer coupled to receive first test data output from the circuit block and second test data output from the programmable logic as respective data inputs; and
wherein the control logic is coupled to receive the state information from the state storing device for selecting between the respective data inputs to provide a test data output.

5. The integrated circuit according to claim 4, wherein the circuit block is a boundary scan block; and
wherein the interface includes a test data in pin, a test mode select pin, a test clock pin, and a test data out pin.

6. The integrated circuit according to claim 5, wherein the integrated circuit is a Field Programmable Gate Array ("FPGA").

7. A method for simultaneously testing a plurality of integrated circuits using a single multi-site testing platform, comprising:
loading the integrated circuits into the ATE multi-site testing platform;
configuring programmable logic of the integrated circuits;
setting the integrated circuits for a non-dedicated function test mode; and
simultaneously first testing the integrated circuits in the non-dedicated function test mode, the first testing using a first portion of dedicated function pins of each of the integrated circuits for providing first information thereto, the first information for processing by the programmable logic of each of the integrated circuits for the first testing.

8. The method according to claim 7, further comprising:
providing first test data output from each of the integrated circuits;
wherein a second portion of the dedicated function pins of each of the integrated circuits is used for respectively providing the first test data output.

9. The method according to claim 8, further comprising:
selecting between test data output paths of each of the integrated circuits for respectively providing the first test data output;
wherein the selecting is responsive to each of the integrated circuits being in the non-dedicated function test mode.

10. The method according to claim 9, further comprising:
setting the integrated circuits for a dedicated function test mode; and
simultaneously second testing the integrated circuits in the dedicated function test mode using the first portion of dedicated function pins of each of the integrated circuits, the first portion of dedicated function pins for providing second information for processing by boundary scan logic of each of the integrated circuits for the second testing.

11. The method according to claim 10, further comprising:
providing second test data output from each of the integrated circuits;
the second portion of the dedicated function pins of each of the integrated circuits being used for respectively providing the second test data output;
selecting between the test data output paths of each of the integrated circuits for respectively providing the second test data output; and
the selecting being responsive to the integrated circuits being in the dedicated function test mode.

12. The method according to claim 8, wherein the first portion of the dedicated function pins of each of the integrated circuits respectively includes a test data in pin, a test mode select pin, and a test clock pin; and wherein the second portion of the dedicated function pins of each of the integrated circuits respectively includes a test data out pin.

13. The method according to claim 7, wherein the first portion of the dedicated function pins of each of the integrated circuits respectively at least one configuration pin selected from a group consisting of data in/data out configuration pins, chip select pins, hot swapping pins, and initialization pins.

14. The method according to claim 13, wherein the integrated circuits are Field Programmable Gate Arrays.

15. A system to simultaneously test multiple integrated circuits, comprising:
- a multi-site testing platform including Automated Test Equipment ("ATE") and a handler, the handler for loading the multiple integrated circuits for electrical communication with the ATE;
- the ATE configured for setting the multiple integrated circuits into a non-dedicated function test mode; and
- the ATE configured for providing non-dedicated function test input to dedicated function pins of the multiple integrated circuits for simultaneously testing programmable logic of the multiple integrated circuits in the non-dedicated function test mode.

16. The system according to claim 15, wherein the dedicated function pins of the multiple integrated circuits each include at least one configuration pin selected from a group consisting of data in/data out configuration pins, chip select pins, hot swapping pins, and initialization pins.

17. The system according to claim 15, wherein the dedicated function pins of the multiple integrated circuits each include a test data in pin, a test mode select pin, and a test clock pin.

18. The system according to claim 17, wherein the multiple integrated circuits each include a test mode memory cell for the setting of the multiple integrated circuits to the non-dedicated function test mode.

19. The system according to claim 18, wherein the multiple integrated circuits each include control logic for controllably passing the non-dedicated function test input to the programmable logic thereof to be tested in the non-dedicated function test mode and for selectively outputting test data responsive thereto.

20. The system according to claim 19, wherein the multiple integrated circuits are multiple Field Programmable Gate Arrays.

* * * * *